United States Patent
Sturcken et al.

(10) Patent No.: US 10,244,633 B2
(45) Date of Patent: Mar. 26, 2019

(54) INTEGRATED SWITCHED INDUCTOR POWER CONVERTER

(71) Applicant: Ferric Inc., New York, NY (US)

(72) Inventors: Noah Sturcken, New York, NY (US);
David Jew, New York, NY (US);
Joseph Meyer, New York, NY (US);
Ryan Davies, New York, NY (US);
Michael Lekas, New York, NY (US)

(73) Assignee: Ferric Inc., New York, NY (US)

( * ) Notice: Subject to any disclaimer, the term of this patent is extended or adjusted under 35 U.S.C. 154(b) by 0 days.

(21) Appl. No.: 15/844,107

(22) Filed: Dec. 15, 2017

(65) Prior Publication Data

US 2018/0110123 A1    Apr. 19, 2018

Related U.S. Application Data

(60) Continuation-in-part of application No. 14/991,111, filed on Jan. 8, 2016, and a continuation-in-part of
(Continued)

(51) Int. Cl.
*H05K 1/18* (2006.01)
*H01F 41/04* (2006.01)
(Continued)

(52) U.S. Cl.
CPC ............. *H05K 1/181* (2013.01); *H01F 27/24* (2013.01); *H01F 27/2804* (2013.01);
(Continued)

(58) Field of Classification Search
CPC . G05F 1/56; G05F 1/181; G05F 1/574; G05F 1/575; H02M 3/156–3/158;
(Continued)

(56) References Cited

U.S. PATENT DOCUMENTS

| | | |
|---|---|---|
| 1,553,983 A | 9/1925 | Casper |
| 2,931,966 A | 4/1960 | Rockey |

(Continued)

FOREIGN PATENT DOCUMENTS

| | | |
|---|---|---|
| FR | 2817622 A1 | 6/2002 |
| JP | 60124859 A | 7/1985 |

(Continued)

OTHER PUBLICATIONS

N. Sturcken et al., "Design of Coupled Power Inductors with Crossed Anisotropy Magnetic Core for Integrated Power Conversion", IEEE-APEC 2012, p. 417-423, doi: 10.1109/APEC.2012.6165853.

(Continued)

*Primary Examiner* — Yemane Mehari
(74) *Attorney, Agent, or Firm* — Intrinsic Law Corp.

(57) ABSTRACT

A switched inductor DC-DC power converter chiplet includes a CMOS power switch, an LC filter, regulation circuitry, feedback control circuitry, and interface control circuitry integrated on a common substrate. The inductor for the LC filter can be formed on the same surface or on opposing surfaces of the substrate as the electrical terminations for the substrate.

22 Claims, 18 Drawing Sheets

Related U.S. Application Data application No. 14/814,033, filed on Jul. 30, 2015, now Pat. No. 9,847,718, said application No. 14/991,111 is a continuation of application No. 14/517,370, filed on Oct. 17, 2014, now Pat. No. 9,357,651, which is a division of application No. 13/609,391, filed on Sep. 11, 2012, now Pat. No. 9,844,141.

(60) Provisional application No. 62/032,758, filed on Aug. 4, 2014.

(51) Int. Cl.

| | | |
|---|---|---|
| *H01F 41/02* | (2006.01) | |
| *H01F 27/28* | (2006.01) | |
| *H01F 27/24* | (2006.01) | |
| *H05K 1/16* | (2006.01) | |
| *H05K 1/02* | (2006.01) | |
| *H05K 1/11* | (2006.01) | |

(52) U.S. Cl.
CPC ........... *H01F 41/02* (2013.01); *H01F 41/041* (2013.01); *H05K 1/0298* (2013.01); *H05K 1/115* (2013.01); *H05K 1/165* (2013.01); *H05K 1/0233* (2013.01); *H05K 2201/086* (2013.01); *H05K 2201/0929* (2013.01); *H05K 2201/1003* (2013.01); *Y02P 70/611* (2015.11); *Y10T 29/4913* (2015.01)

(58) Field of Classification Search
CPC ............. H02M 3/1582; H02M 3/1584; H02M 3/1588; H01F 27/24; H01F 27/2804; H01F 41/041; H05K 1/0298; H05K 1/115; H05K 1/165
USPC ....... 323/222, 224, 225, 235, 271, 272, 274, 323/282–285
See application file for complete search history.

(56) References Cited

U.S. PATENT DOCUMENTS

| | | | |
|---|---|---|---|
| 3,110,613 A | 11/1963 | Bean | |
| 3,614,554 A | 10/1971 | Shield et al. | |
| 4,025,379 A | 5/1977 | Whetstone | |
| 5,070,317 A | 12/1991 | Bhagat | |
| 5,225,971 A | 7/1993 | Spreen | |
| 5,319,343 A | 6/1994 | Jeffries | |
| 5,583,474 A | 12/1996 | Mizoguchi | |
| 5,635,892 A | 6/1997 | Ashby | |
| 5,831,431 A | 11/1998 | Gottfried-Gottfried et al. | |
| 6,118,351 A | 9/2000 | Kossives et al. | |
| 6,362,986 B1 | 3/2002 | Schultz | |
| 6,542,060 B2 | 4/2003 | Fedeli | |
| 6,542,379 B1 | 4/2003 | Lauffer | |
| 6,856,226 B2 | 2/2005 | Gardner | |
| 6,940,384 B2 | 9/2005 | Hooey et al. | |
| 7,230,408 B1* | 6/2007 | Vinn | H02M 3/156 323/273 |
| 7,554,399 B1* | 6/2009 | Gaboriau | H03F 1/305 330/207 A |
| 7,636,242 B2 | 12/2009 | Hazucha | |
| 7,719,084 B2 | 5/2010 | Gardner | |
| 7,867,787 B2 | 1/2011 | Gardner | |
| 8,108,984 B2 | 2/2012 | Gardner | |
| 8,432,144 B2 | 4/2013 | Notani | |
| 8,558,344 B2 | 10/2013 | Chen | |
| 2002/0060621 A1 | 5/2002 | Duffy et al. | |
| 2002/0136929 A1 | 9/2002 | Oikawa et al. | |
| 2003/0070282 A1 | 4/2003 | Hiatt et al. | |
| 2004/0135661 A1 | 7/2004 | Haugs et al. | |
| 2005/0088269 A1 | 4/2005 | Hatano et al. | |
| 2005/0156704 A1 | 7/2005 | Gardner et al. | |
| 2006/0197510 A1* | 9/2006 | Chandrasekaran | H02M 3/1588 323/222 |
| 2006/0263727 A1 | 11/2006 | Lee et al. | |
| 2006/0273418 A1* | 12/2006 | Chung | G11C 11/16 257/421 |
| 2007/0037414 A1 | 2/2007 | Yamauchi et al. | |
| 2007/0290362 A1 | 12/2007 | Hsu et al. | |
| 2008/0003699 A1 | 1/2008 | Gardner et al. | |
| 2008/0316647 A1 | 12/2008 | Joisten | |
| 2009/0007418 A1 | 1/2009 | Edo et al. | |
| 2009/0068762 A1 | 3/2009 | Takahashi et al. | |
| 2009/0175014 A1 | 7/2009 | Zeng et al. | |
| 2009/0188104 A1 | 7/2009 | Ching et al. | |
| 2011/0279214 A1 | 11/2011 | Lee et al. | |
| 2013/0056847 A1 | 3/2013 | Chen | |
| 2013/0099334 A1 | 4/2013 | Mohan | |
| 2013/0099762 A1* | 4/2013 | Terrovitis | H02M 1/32 323/271 |
| 2014/9927879 | 1/2014 | Weyers et al. | |
| 2014/0068932 A1 | 3/2014 | Sturcken | |
| 2014/0071636 A1 | 3/2014 | Sturcken | |
| 2014/0240074 A1 | 8/2014 | Qui et al. | |
| 2015/0036308 A1 | 2/2015 | Sturcken | |
| 2015/0137776 A1* | 5/2015 | Thomas | H02M 3/1588 323/271 |

FOREIGN PATENT DOCUMENTS

| | | |
|---|---|---|
| JP | 01028957 A | 1/1989 |
| JP | 05082736 A | 4/1993 |
| JP | 05291063 | 11/1993 |
| JP | H09162354 A | 6/1997 |
| WO | WO2012166877 A1 | 12/2012 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, pp. 1-166, Columbia University.

* cited by examiner

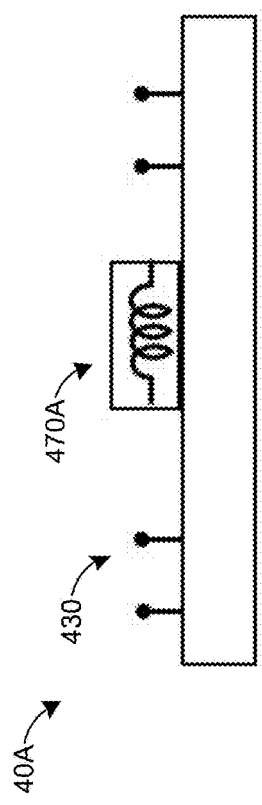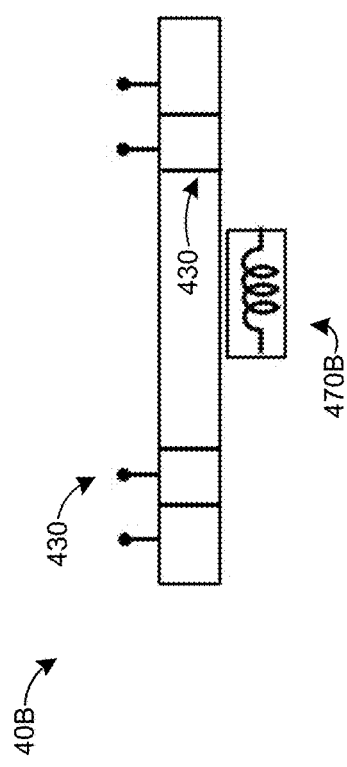

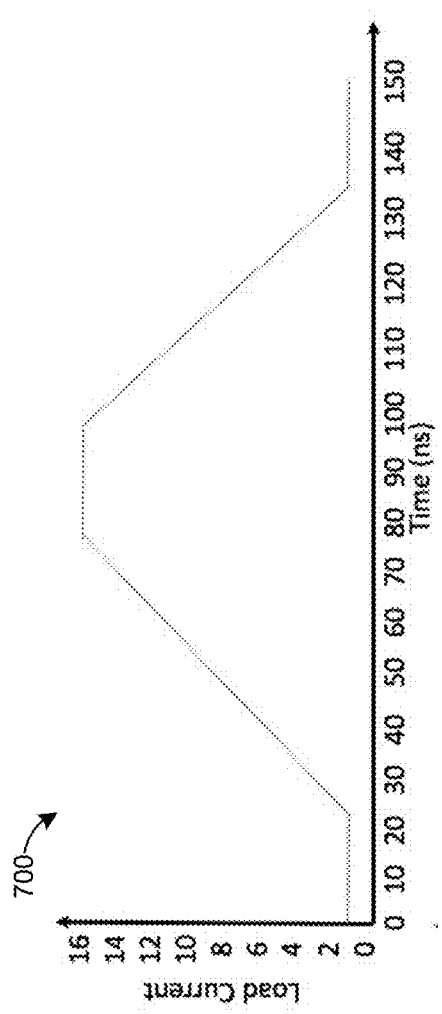
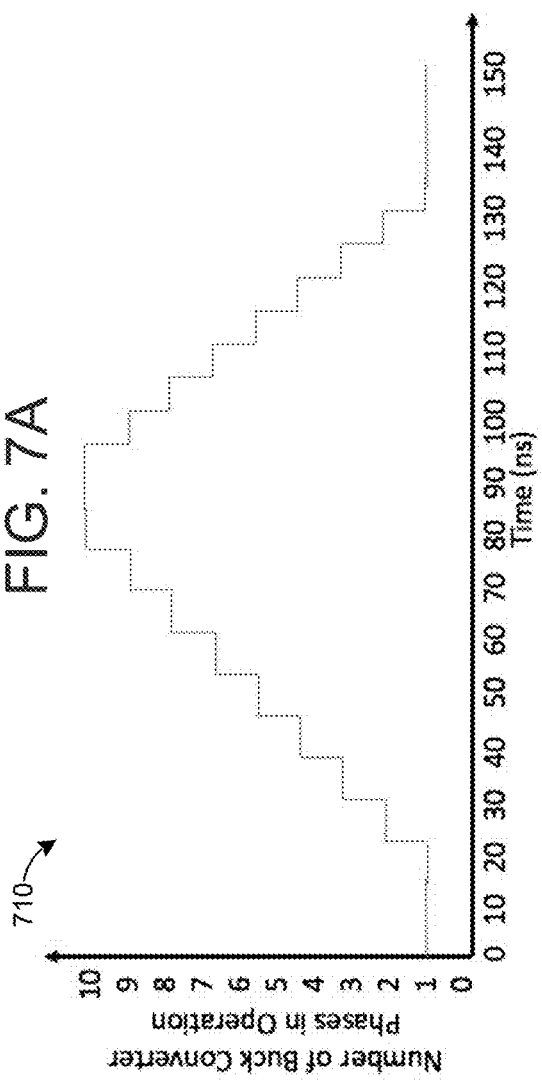
FIG. 7A
FIG. 7B

INTEGRATED SWITCHED INDUCTOR POWER CONVERTER

RELATED APPLICATIONS

The present application is a continuation-in-part (CIP) of U.S. application Ser. No. 14/814,033, filed on Jul. 30, 2015, which claims the benefit of Provisional Application No. 62/032,758, filed on Aug. 4, 2014, entitled "Apparatus and Methods for Integrated Power Converter with High Bandwidth"; and is a continuation-in-part (CIP) of U.S. application Ser. No. 14/991,111, filed on Jan. 8, 2016, entitled "Magnetic Core Inductor Integrated with Multilevel Wiring Network", which in turn claims priority to and is a continuation of U.S. patent application Ser. No. 14/517,370, now U.S. Pat. No. 9,357,651, filed on Oct. 17, 2014, entitled "Magnetic Core Inductor Integrated with Multilevel Wiring Network," which is a divisional application of U.S. application Ser. No. 13/609,391, now U.S. Pat. No. 9,844,141, filed on Sep. 11, 2012, entitled "Magnetic Core Inductor Integrated with Multilevel Wiring Network." The present application is also related to U.S. patent application Ser. No. 13/613,011, now U.S. Pat. No. 9,357,650, filed on Sep. 13, 2012, entitled "Magnetic Core Inductor Integrated with Multilevel Wiring Network". The present application claims the benefit of the above, and each of the foregoing is hereby incorporated by reference.

TECHNICAL FIELD

The present application relates generally to power converters for integrated circuits.

BACKGROUND

Switched inductor DC-DC power converters and buck converters provide conversion of power from a high voltage potential to a low voltage potential. These types of converters are used in a broad and diverse set of applications. One typical application is the conversion and regulation of power supplies for microprocessors and other sensitive or high performance integrated circuits.

With the development of highly integrated electronic systems that consume large amounts of electricity in very small areas, the need arises for new technologies that enable improved energy efficiency and power management for future integrated systems.

SUMMARY

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings.

One embodiment is directed to a switched inductor DC-DC power converter, comprising a CMOS power switch; an LC filter electrically coupled to an output of the CMOS power switch, the LC filter comprising a thin-film inductor electrically coupled to the output of the CMOS power switch; an output capacitor electrically coupled to an output of the thin-film inductor; regulation circuitry electrically coupled an input of the CMOS power switch; feedback control circuitry that regulates a switching frequency of the CMOS power switch; and interface circuitry electrically coupled to an input of the control circuitry, wherein the switched inductor DC-DC power converter is integrated on a common substrate.

Another embodiment is directed to a system comprising a power converter substrate comprising a CMOS power switch; regulation circuitry electrically coupled an input of the CMOS power switch; feedback control circuitry that regulates a switching frequency of the CMOS power switch; and interface circuitry electrically coupled to an input of the control circuitry; an interposer comprising a thin-film inductor, wherein an input of the thin-film inductor is electrically coupled to an output of the CMOS power switch.

BRIEF DESCRIPTION OF THE DRAWINGS

For a fuller understanding of the nature and advantages of the present invention, reference is made to the following detailed description of preferred embodiments and in connection with the accompanying drawings, in which:

FIG. 4A is a schematic of switched inductor DC-DC power converter chiplets to illustrate possible locations to integrate the thin-film inductor;

FIG. 4B is another schematic of switched inductor DC-DC power converter chiplets to illustrate possible locations to integrate the thin-film inductor;

FIG. 7A is a graph that illustrates an example of a time-domain representation of how the control circuitry can vary the number of phases according to load current variation;

FIG. 7B is another graph that illustrates an example of a time-domain representation of how the control circuitry can vary the number of phases according to load current variation;

DETAILED DESCRIPTION

Figure 1:
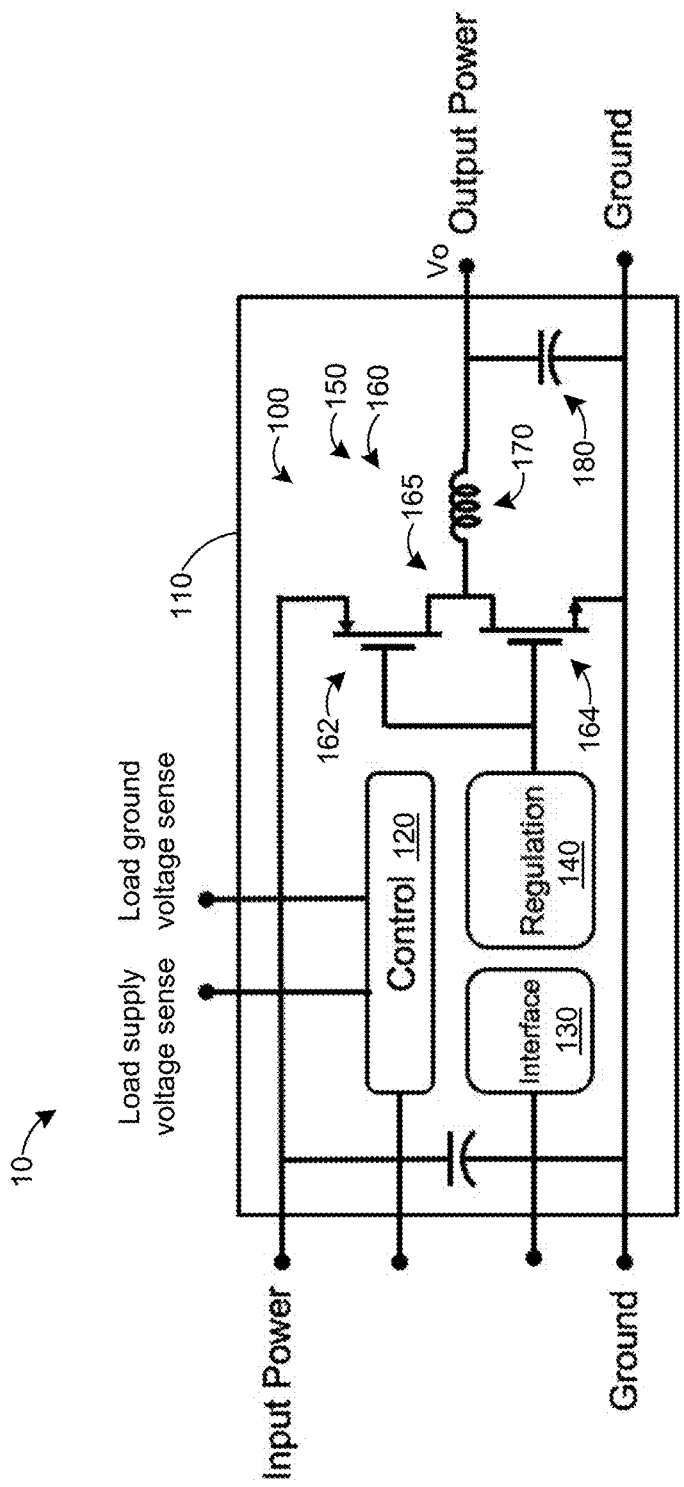
FIG. 1 is a schematic representation of a switched inductor DC-DC power converter chiplet 10 according to one or more embodiments.

FIG. 1 is a schematic representation of a switched inductor DC-DC power converter chiplet 10 according to one or more embodiments. A switched inductor DC-DC power converter 100 is fabricated and/or integrated on a common power converter substrate 110, such as a silicon substrate. The switched inductor DC-DC power converter 100 includes feedback control circuitry 120, interface circuitry 130, regulation circuitry 140, and power train 150. Power train 150 includes power switch 160, thin-film inductor 170, and output capacitor 180. Power switch 160 can be a CMOS power switch comprising PMOS and NMOS transistor gates 162, 164, respectively. Each transistor gate 162, 164 can include two switches in series in a cascode configuration, as discussed below.

Feedback control circuitry 120 is configured to open and close PMOS and NMOS transistor gates 162, 164. When PMOS transistor gate 162 is open, NMOS transistor gate 164 is closed and vice-versa. Opening and closing PMOS and NMOS transistor gates 162, 164 generates a pulse width modulation (PWM) signal at the output of half-bridge node 165. The frequency of the PWM signal can be configured in feedback control circuitry as known in the art. Feedback control circuitry 120 is configured to adjust the duty cycle of the PWM signal to raise or lower the output voltage Vo so that the output voltage Vo equals a target output voltage. Feedback control circuitry 120 monitors the output voltage Vo through load supply voltage sense and load ground sense feedback lines, as illustrated in FIG. 1. The separate supply voltage sense and ground reference sense lines allow the power converter chiplet 10 to measure the output voltage at the load independent of the power delivery channel.

Feedback control circuitry 120 calculates a voltage error, which is the difference between the output voltage Vo and the target output voltage. The target output voltage can be set manually or pre-programmed based on the specifications of the load. If there is a positive voltage error (i.e., the output voltage Vo is greater than the target output voltage), feedback control circuitry 120 can respond by decreasing the duty cycle of the PWM signal generated by power switch 160. If there is a negative voltage error (i.e., the actual output voltage Vo is less than the target output voltage), feedback control circuitry 120 can respond by increasing the duty cycle of the PWM signal generated by power switch 160.

Interface circuitry 130 providing an interface connection or connections between one or more electrical contact points on said chip or circuit and one or more electrical contact points off of said chip or circuit.

Regulation circuitry 140 is configured to open and close the PMOS and NMOS transistor gates 162, 164 according to the PWM signal generated by control circuitry 120.

Thin-film inductor 170 and output capacitor 180 form a low pass filter as known in the art. The thin-film inductor 170 is formed in the multilevel wiring network of the power converter substrate 110 as described herein. The thin-film inductor 170 can include a magnetic core inductor and/or a magnetic clad inductor.

In some embodiments, one or more digital processing units, such as a microprocessor and/or a graphics processor are disposed on the common power converter substrate 110.

Figure 1A:
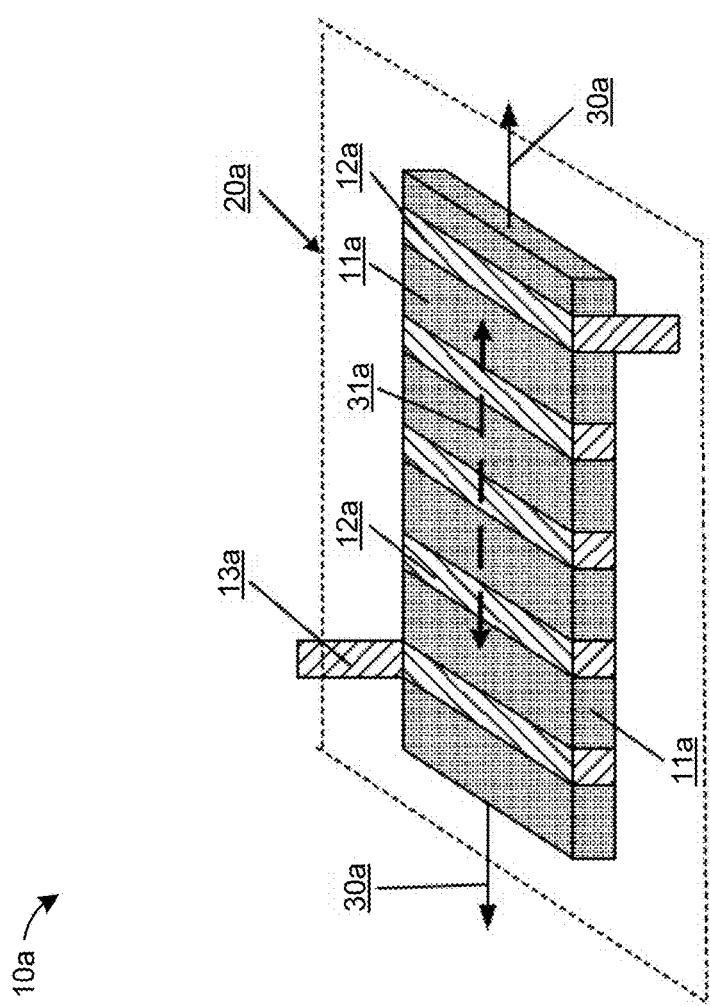
FIG. 1A shows a schematic view of a planar magnetic core inductor with windings on the outside.

FIG. 1A shows a schematic view of a planar magnetic core inductor 10a with windings on its outside as can be used in the inductors described herein. The magnetic core 11a is a planar structure having, and defining, a principal plane 20a. The planar magnetic core 11a may typically be of a rectangular shape. The conductive winding 12a of the inductor is made to spiral around the outside of the planar core 11a. The conductive winding 12a has leads 13a that may connect to the winding in any desirable manner without limitation.

The direction 30a of a magnetic field that is induced when an electrical current is flowing in the conductive winding 12a is substantially in the principal plane directed substantially along the winding spiral, and pointing in a direction that depends on the direction of the current in the winding. As it is known in the art, many magnetic material are anisotropic, and possess so called hard and soft axes of magnetization. The planar magnetic core 11a in representative embodiments of the invention is fabricated to have its hard-axis 31a of magnetization aligned substantially in parallel with the magnetic field 30a that is induced when an electrical current is flowing in the conductive windings 12a. Such an alignment for the material of the magnetic core 11a is desirable because along the hard-axis the core magnetization exhibits less hysteresis and has a substantially linear dependence on the current in the winding 12a, resulting in more energy efficient operation of the inductor.

Figure 2:
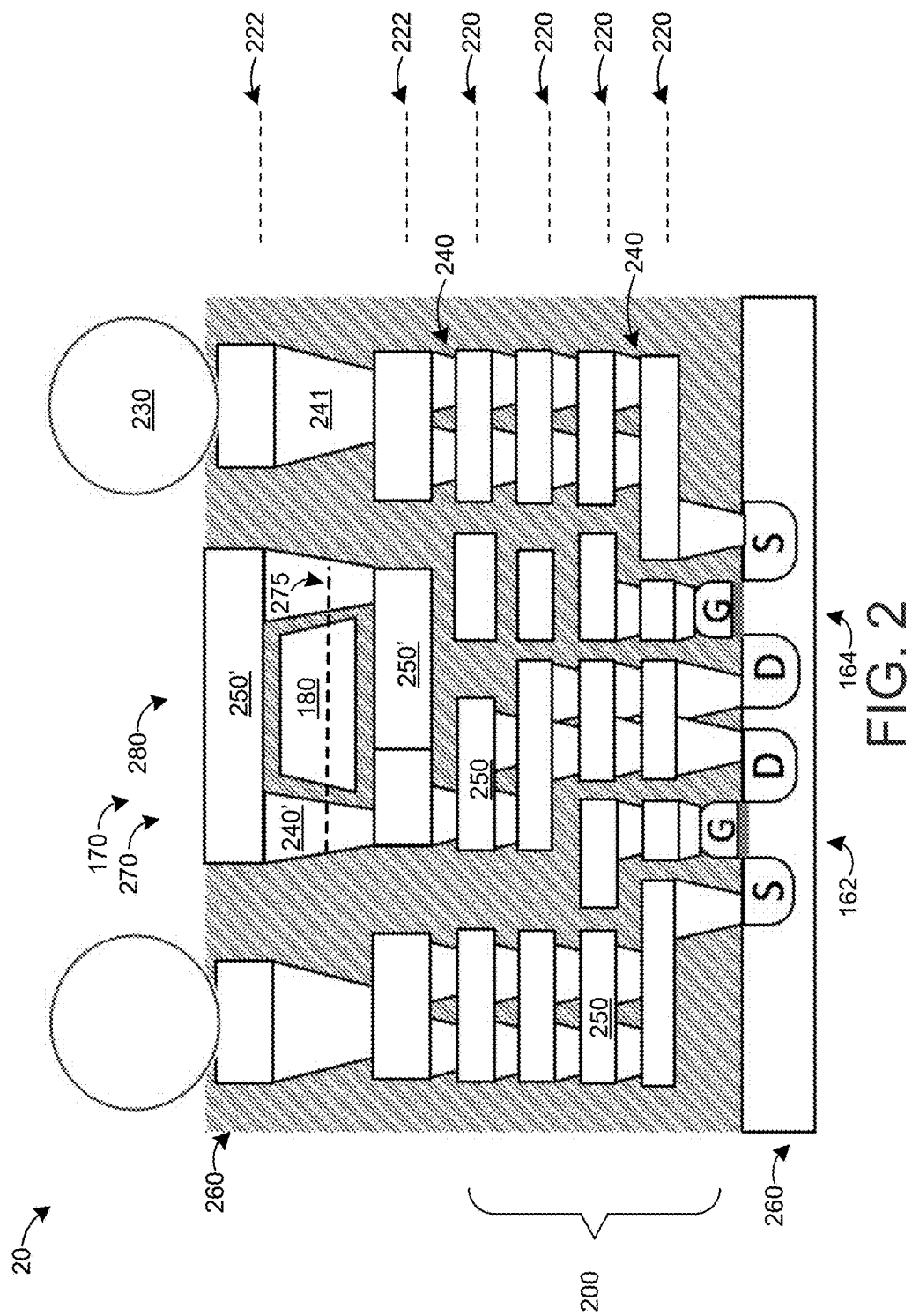
FIG. 2 is a cross section of the switched inductor DC-DC power converter chiplet illustrated in FIG. 1 according to a first embodiment.

FIG. 2 is a cross section 20 of the switched inductor DC-DC power converter chiplet 10 illustrated in FIG. 1 according to a first embodiment. In the embodiment illustrated in FIG. 2, the thin film-inductor 170 includes a magnetic core inductor 270 integrated on top of multilevel wiring network 200.

The cross section 20 illustrates PMOS and NMOS transistor gates 162, 164 fabricated on power converter substrate 110. The multilevel wiring network 200 provides electrical connections between the PMOS and NMOS transistor gates 162, 164, the magnetic core inductor 270, and IC chip contact structures 210. The multilevel wiring network 200 is arranged into wiring planes 220. FIG. 2 depicts 4 wiring planes 220 but without limitation on any actual number of planes. Each wiring plane 220 contains wire segments 250. Electrical connections between wire segments 250 of differing wiring planes 220 are provided by VIAs 240. IC chip contact structures 230 can be C4 contacts, solder bumps, or copper pillars, but any other contacts for the chip's external communication are acceptable without limitation. The spaces in the multilevel wiring network 200 are filled with a dielectric insulating material 260 such as $SiO_2$.

The magnetic core inductor 270 with a single planar magnetic core 180 is integrated on top of the multilevel wiring network 200. The principal plane 275 of the planar magnetic core 180 is substantially parallel with the wiring planes 220. The conductive winding 280 of the magnetic core inductor 270, forming a general spiral on the outside of the planar magnetic core 180, is piecewise constructed of wire segments 250' and of VIAs 240' that are disposed in at least two integration planes 222, which are formed on the multilevel wiring network 200. The VIAs 240' that form parts of the windings 280 are vertical to the principal plane 275 and interconnect the at least two integration planes 222.

The magnetic core 180 can include a ferromagnetic material such as Co, Ni, and/or Fe, for example $Ni_xFe_y$ or $Co_xNi_yFe_z$. In addition, or in the alternative, magnetic core 180 can include a plurality of layers. The layers can include alternating layers of ferromagnetic layers (e.g., Co, Ni, and/or Fe, an alloy of Co, Ni, and/or Fe, etc.) and non-ferromagnetic layers. For example, the non-ferromagnetic layers can be or can include an insulating material, such as the oxides of the ferromagnetic material (e.g., $Co_xO_y$, $Ni_xO_y$, and/or $Fe_xO$).

In some embodiments, an interface layer can be deposited on the insulating material layer. The interface layer can be used in the fabrication process to help deposit the next ferromagnetic layer onto the insulating material layer. The material comprising interface layer can be selected to improve adhesion and/or reduce roughness at the interface between the ferromagnetic layer and the insulating material layer. Reducing the roughness at the interface of the ferromagnetic layer and the insulating material layer can reduce coercivity for the magnetic core 180. Improving the adhesion between the ferromagnetic layer and the insulating material layer can reduce the potential for film delamination. Additionally, the interface layer can serve as a diffusion barrier or getter between the ferromagnetic layer and the insulating material layer to prevent the diffusion of material constituents from the insulating material layer to the ferromagnetic layer. Finally, the interface layer can be chosen to reduce or compensate mechanical film stress in the magnetic core 180. The interface layer can be comprised of one or more of Ta, Ti, W, Cr, or Pt, or a combination thereof, depending on the particular choice of ferromagnetic material and insulating material layer.

In some embodiments, the non-ferromagnetic layers can be or can include a current-rectifying layer. For example, the current-rectifying layers can be based on Schottky diodes. Onto the ferromagnetic layer one may electrodeposit the following sequence: a semiconducting layer-p-type with work function less than ferromagnetic layer or n-type with work function greater than ferromagnetic layer; followed by an interface metal layer—with a work function less than that of p-type semiconducting material, or greater than that of n-type semiconducting material. Then, continue with the next ferromagnetic layer, and so on. Alternatively, for rectification one may use a semiconductor p-n junction in the non-ferromagnetic layer. Any semiconductor may be suitable, one would have to choose one based on several criteria, for example without limiting, the ease of contact to the magnetic material of the p and n portions, how narrow can one make the junction, and others.

In some embodiments, the magnetic core inductor 270 is the same as, substantially the same as, or similar to one or more of the inductors described in U.S. patent application Ser. No. 15/391,278, U.S. Patent Application Publication No. 2014/0071636, and/or U.S. Pat. No. 9,647,053, which are hereby incorporated by reference. In some embodiments, the switched inductor DC-DC power converter chiplet 10 and cross-section 20 include a plurality of inductors, each of which can be the same or similar to inductor 170. The plurality of inductors can be arranged in parallel electrically with one another, in series electrically with one another, or a combination thereof. The plurality of inductors can be integrated on the same integration planes 222 or in different integration planes.

Figure 3:
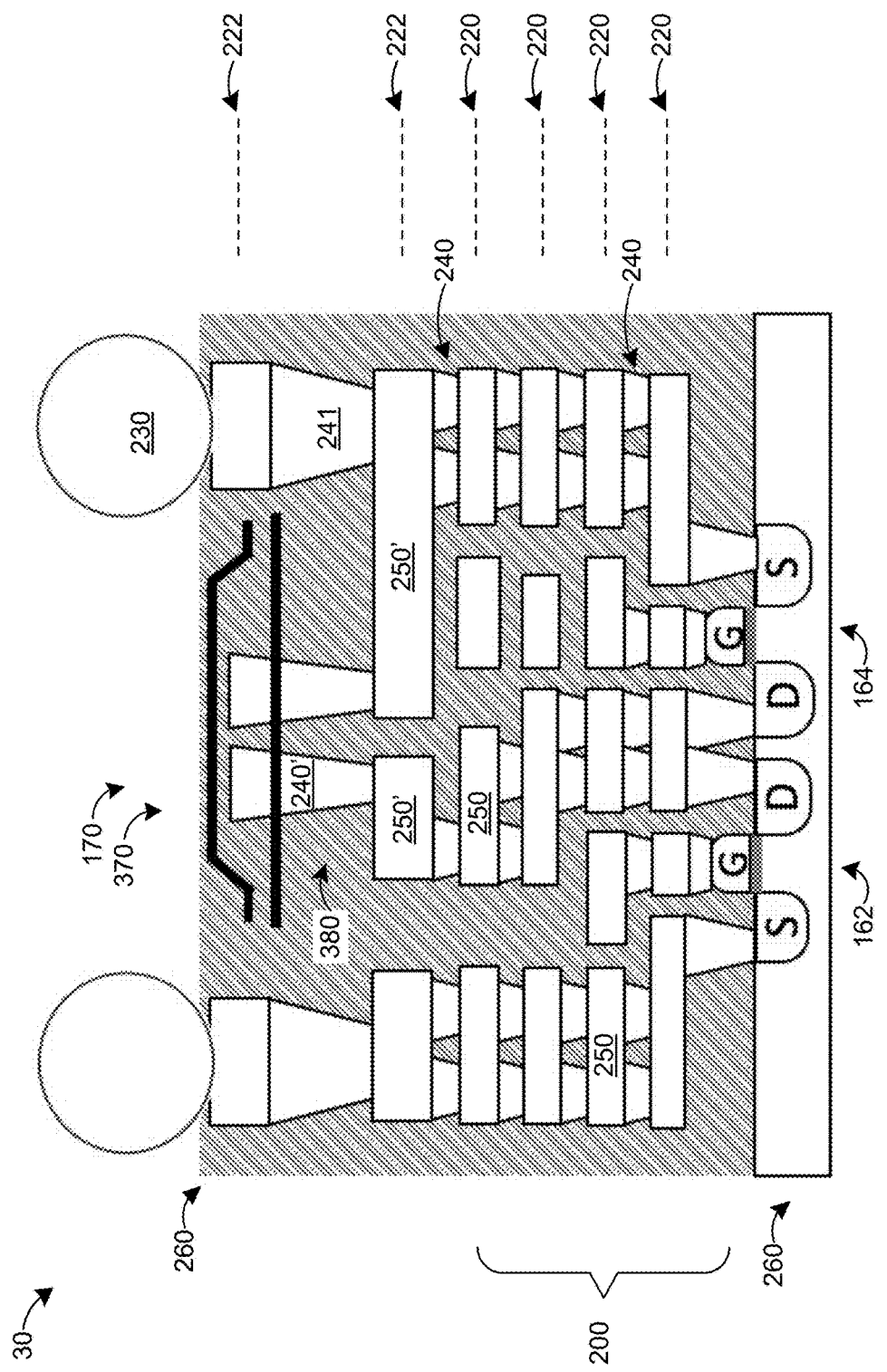
FIG. 3 is a cross section of the switched inductor DC-DC power converter chiplet illustrated in FIG. 1 according to a second embodiment.

FIG. 3 is a cross section 30 of the switched inductor DC-DC power converter chiplet 10 illustrated in FIG. 1 according to a second embodiment. Cross section 30 is the same or substantially the same as cross section 20 except as described below. In the embodiment illustrated in FIG. 3, the thin film-inductor 170 includes a magnetic clad inductor 370 integrated on top of multilevel wiring network 200. The magnetic clad inductor 370 includes a ferromagnetic yoke 375 that surrounds a conductive winding 380. The ferromagnetic yoke 375 can include Co, Ni, and/or Fe, such as $Ni_xFe_y$, or other material as known in the art. The conductive winding 380 forms a general spiral over which the yoke 375 is disposed.

The conductive winding 380 is piecewise constructed of wire segments 250' and of VIAs 240' in at least two integration planes 222. The VIAs 240' that form parts of the windings 380 are interconnecting the at least two integration planes 222. It is noted that the wire segments 250' in the top integration plane 222 are not illustrated in FIG. 3 since they would not be visible in cross section 30.

In some embodiments, the switched inductor DC-DC power converter chiplet 10 and cross-section 30 include a plurality of inductors, each of which can be the same or similar to inductor 370. The plurality of inductors can be arranged in parallel electrically with one another, in series electrically with one another, or a combination thereof. The plurality of inductors can be integrated on the same integration planes 222 or in different integration planes 222.

FIGS. 4A and 4B are schematics of switched inductor DC-DC power converter chiplets 40A, 40B, respectively, to illustrate possible locations to integrate the thin-film inductor. In FIG. 4A, the thin-film inductor 470A is integrated on the same side of chiplet 40A as the electrical terminations 430, for example as illustrated in cross sections 20 and 30. Electrical terminations 430 can be the same as or similar to IC chip contact structures 230. In FIG. 4B, the thin-film inductor 470B is integrated on the opposite or back side of chiplet 40B with respect to the electrical terminations 430. Through-silicon VIAs 440 electrically connect the thin-film inductor 470B to the multilevel wiring network on the opposite side of chiplet 40B.

The advantage to integrating the thin-film inductor on the same side of the chiplet as the electrical terminations (e.g., as illustrated in FIGS. 2, 3, and 4A) is that the device is simpler (and less expensive) to manufacture, since it is an extension of existing back-end-of-the-line (BEOL) fabrication processes. The disadvantage to integrating the thin-film inductor on the same side of the chiplet as the electrical terminations is that the inductors and electrical terminations "compete" for space in the semiconductor design. Since the thin-film inductor (e.g., inductor 270, 370) is disposed at or near the level of the electrical contacts and their underlying VIAs (e.g., IC chip contact structures 230 and their underlying VIAs 241), the electrical contacts need to be spaced apart sufficiently to provide room for the inductor, which may increase the size of the chiplet.

The advantage to integrating the thin-film inductor on the opposite side of the chiplet with respect to the electrical terminations is that the inductors and electrical terminations no longer "compete" for space in the semiconductor design. As such, the electrical contacts and their underlying VIAs can be designed in a more compact arrangement without having to account for space for the inductor, which may decrease the size of the chiplet. The disadvantage to integrating the thin-film inductor on the opposite side of the chiplet with respect to the electrical terminations is that the device is more complex (and more expensive) to manufacture, requiring additional processing steps to form the through-silicon VIAs 440 and to fabricate the inductors on the opposite side of the chiplet as the BEOL multilevel wiring network.

Figure 5:
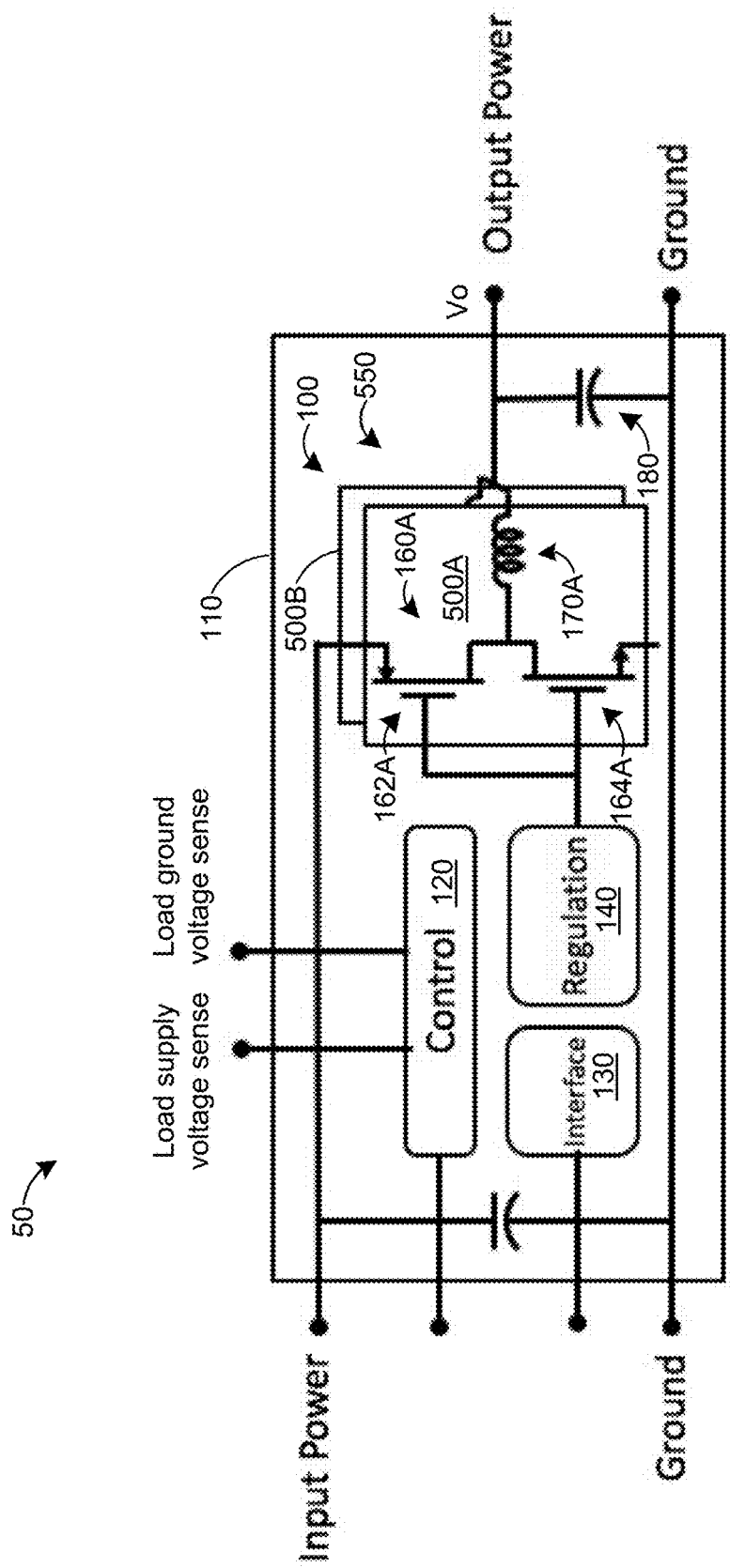
FIG. 5 is a schematic representation of a switched inductor DC-DC power converter chiplet according to one or more embodiments.

FIG. 5 is a schematic representation of a switched inductor DC-DC power converter chiplet 50 according to one or more embodiments. Switched inductor DC-DC power converter chiplet 50 is the same or substantially the same as switched inductor DC-DC power converter chiplet 10 expect as described below. In contrast to DC-DC power converter chiplet 10, the power train 550 of DC-DC power converter chiplet 50 is divided into phases 500A, 500B (in general, phase 500N). Each phase 500N includes a separate power switch 160N and thin-film inductor 170N. For example, phase 500A includes power switch 160A and thin-film inductor 170A. Power switch 160A includes PMOS and NMOS transistor gates 162A, 164A, respectively. Similarly, phase 500B is identical to phase 500A and thus includes its own power switch 160B and thin-film inductor 170B (not illustrated in FIG. 5). Switched inductor DC-DC power converter chiplet 50 can include additional phases 500N as desired. Each phase 500N is electrically in parallel with the other phases 500N. A common output terminal electrically couples the output of each phase 500N to the output power line. A common input terminal electrically couples the input of each phase 500N to the input power line.

Figure 5A:
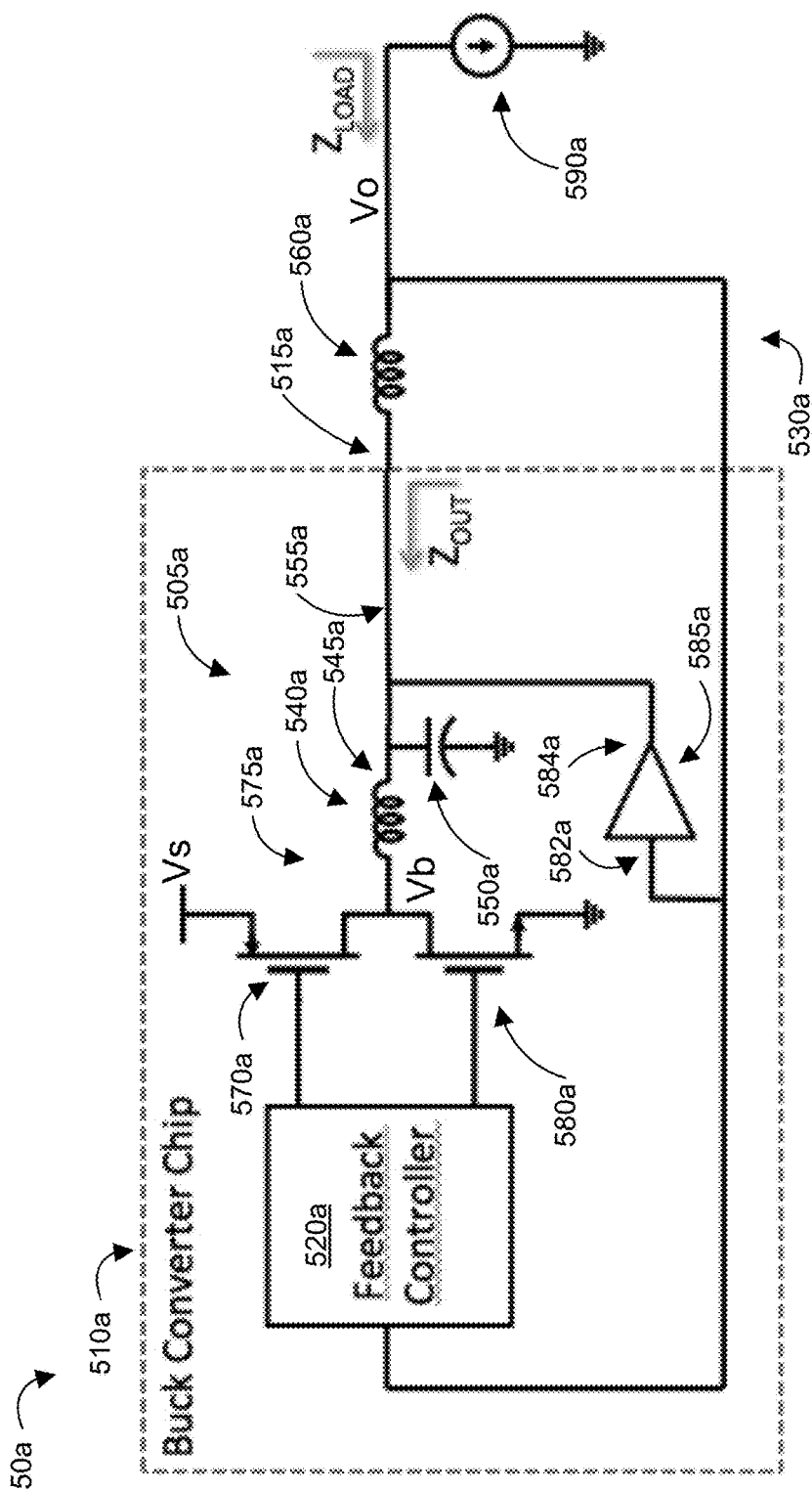
FIG. 5A illustrates a schematic view of an exemplary power converter with voltage sensing feedback loop and linear control element.

FIG. 5A illustrates a schematic view of an exemplary power conversion system 50a with voltage sensing feedback loop 530a and linear control element 580a, according to an embodiment. Buck converter chip 510a comprises feedback controller 520a, CMOS PWM signal generator 575a (comprised of a CMOS device), series inductor 540a, shunt capacitor 550a, feedback loop 530a and linear control element 585a. As discussed above, series inductor 540a and shunt capacitor 550a form a low pass filter 555a assuming a resistive load thereto. A switched inductor power converter 505a is formed by the feedback controller 520a, CMOS PWM signal generator 575a, and the low pass filter (series inductor 540a and shunt capacitor 550a).

CMOS PWM signal generator 575a comprises PMOS 570a and NMOS 580a transistors to produce a periodic rectangular wave with a predetermined frequency as previously described. Feedback controller 520a compensates for high current loads 590a and variations in input power (Vs) by monitoring output voltage (Vo) proximal to the load 590a via voltage sensing loop 530a. The feedback controller 520a calculates a voltage error, which is the difference between the actual output voltage Vo and a target output voltage. The target output voltage can be set manually or pre-programmed based on the specifications of the load 590a. If there is a positive voltage error (i.e., the actual output voltage Vo is greater than the target output voltage), the feedback controller 520a responds by increasing the duty cycle of the PWM signal generated by CMOS PWM signal generator 575a. If there is a negative voltage error (i.e., the actual output voltage Vo is less than the target output voltage), the feedback controller 520a responds by decreasing the duty cycle of the PWM signal generated by CMOS PWM signal generator 575a. The switched inductor power converter 505a is configured to respond to low frequency variations in voltage error (e.g., less than the LC resonance frequency of the output low pass filter). Frequencies higher than the LC resonance frequency cannot pass through the series inductor 540a.

Thus, the feedback controller 520a modulates the duty cycle of the PWM signal to create a constant (or substantially constant) actual output voltage Vo. In some embodiments, the feedback controller 520a modulates the duty cycle of the PWM signal using a PID (proportional-integral-differential), PI, or PD controller. The output of the low pass filter also remains relatively constant which is the average value of the switching signal which is equal to the voltage of the input power supply (Vs) multiplied by the duty cycle of the PWM signal.

PWM signal drives current though series inductor 540a at the bridge voltage (Vb). The second terminal 545a of series inductor 540a is wired to output power to delivery line 555a and shunt capacitor 550a in parallel. The fundamental frequency of the PWM signal is configured to be higher than the LC resonance of the output low pass filter, which is determined by series inductor 540a and shunt capacitor 550a and parasitic inductance 560a.

Series resistance in the series inductor 540a, shunt capacitor 550a and switches 570a, 580a of the CMOS PWM signal generator 575a all result in loss. Similarly, a parasitic inductance 560a occurs along the delivery line 555a (e.g., circuit trace elements) from the buck converter chip 510a output 515a to the load 590a which also detrimentally affects the functionality of the power conversion system 50a.

The efficacy of load regulation by the feedback controller 520a is diminished due to the parasitic capacitances, parasitic inductance 560a and inherent resistivity in the circuit elements. In one configuration, a separate linear control element 585a is added to the buck converter chip 510a. The input 582a of the linear control element 585a monitors the output voltage Vo from the feedback loop/voltage sensing path 530a. The output 58a4 of the linear control element 585a contributes to the regulation of the output voltage Vo by responding to high frequency variations (e.g., greater than the LC resonance frequency of the output low pass filter) in the output voltage Vo as discussed below.

In some embodiments, linear control element 585 is a low-dropout (LDO) regulator. Yet, any suitable DC voltage regulator is not beyond the scope of the present invention. A low-dropout or LDO regulator is a DC linear voltage regulator that can operate with a very small input-output differential voltage. In the present configuration illustrated in FIG. 5A, the effectiveness of the linear control element 585 is somewhat limited because the linear controller element 585 is still filtered by the shunt capacitor 550 and parasitic inductance 560.

Figure 6:
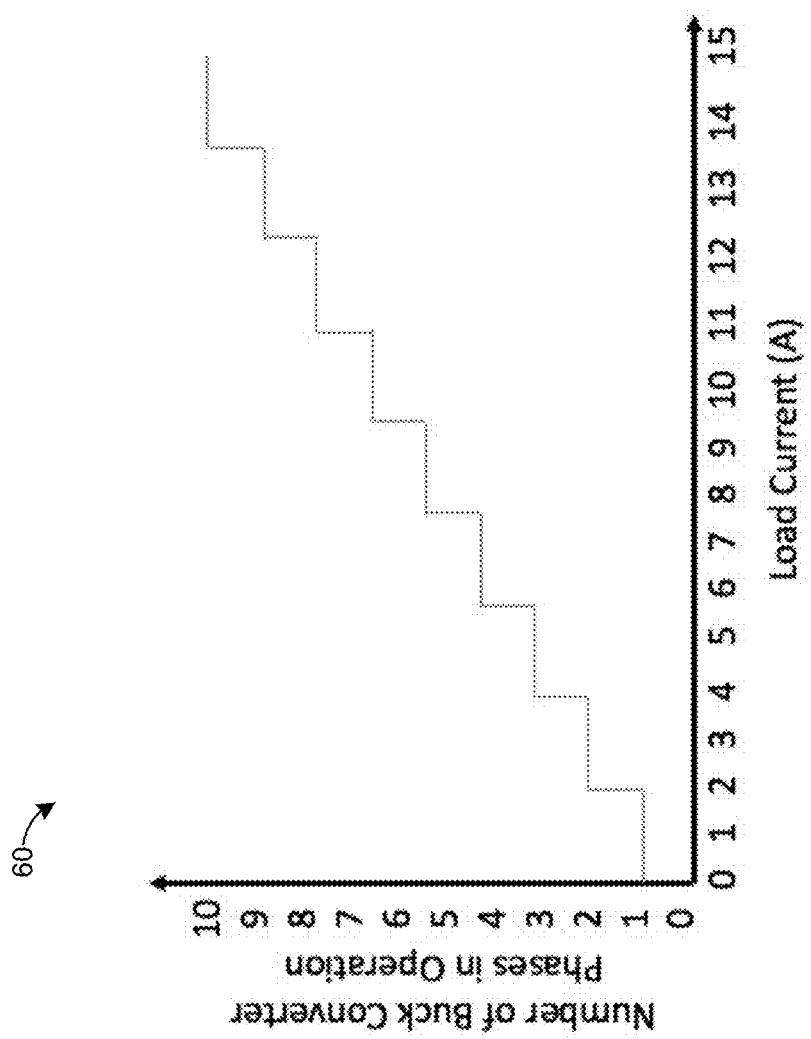
FIG. 6 is a graph that illustrates an example of the relationship between the number of phases in operation and the load current.

Control circuitry 120 of FIG. 5 can vary the number of phases 500N that are electrically connected to the load current to improve power conversion efficiency. An example of the relationship between the number of phases 500N in operation and the load current is illustrated in graph 60 in FIG. 6. An example of a time-domain representation of how the control circuitry 120 can vary the number of phases 500N by turning them on and off according to the load current variation is illustrated in graphs 700 and 710 in FIGS. 7A and 7B, respectively. The phases 500N can be turned on or off very quickly (e.g., response time less than 10 ns), which allows the control circuitry 120 to improve high-frequency (e.g., greater than 10 MHz) supply voltage regulation.

Figure 8:
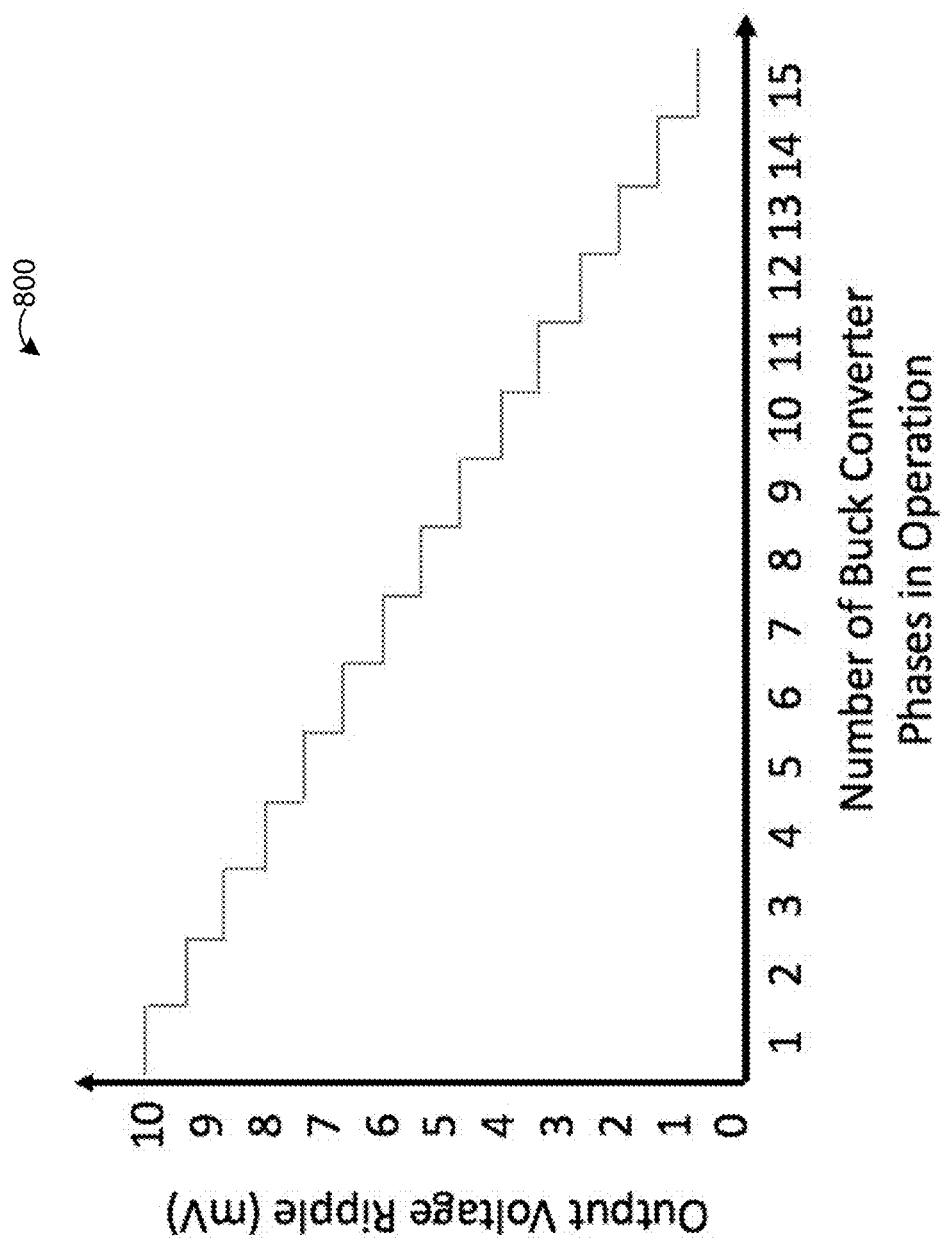
FIG. 8 is a graph that illustrates an example of how relative phase offsets can reduce the output voltage ripple as a function of the number of phases in operation.

In some embodiments, the control circuitry 120 can operate the phases 500N in a phase-interleaved manner so that deconstructive interference occurs (e.g., due to an offset in the relative phase of the current that passes through phases 500N) at the switching frequency to reduce the output voltage ripple. An example graph 800 of the reduction in the output voltage ripple as a function of the number of phases 500N in operation is illustrated in FIG. 8.

In some embodiments, the load current can vary, which may cause an error or deviation in the output voltage Vo. A "load-line" can be applied which varies the target output voltage according to the load current in order to reduce the maximum possible supply voltage variation over load current.

Figure 9:
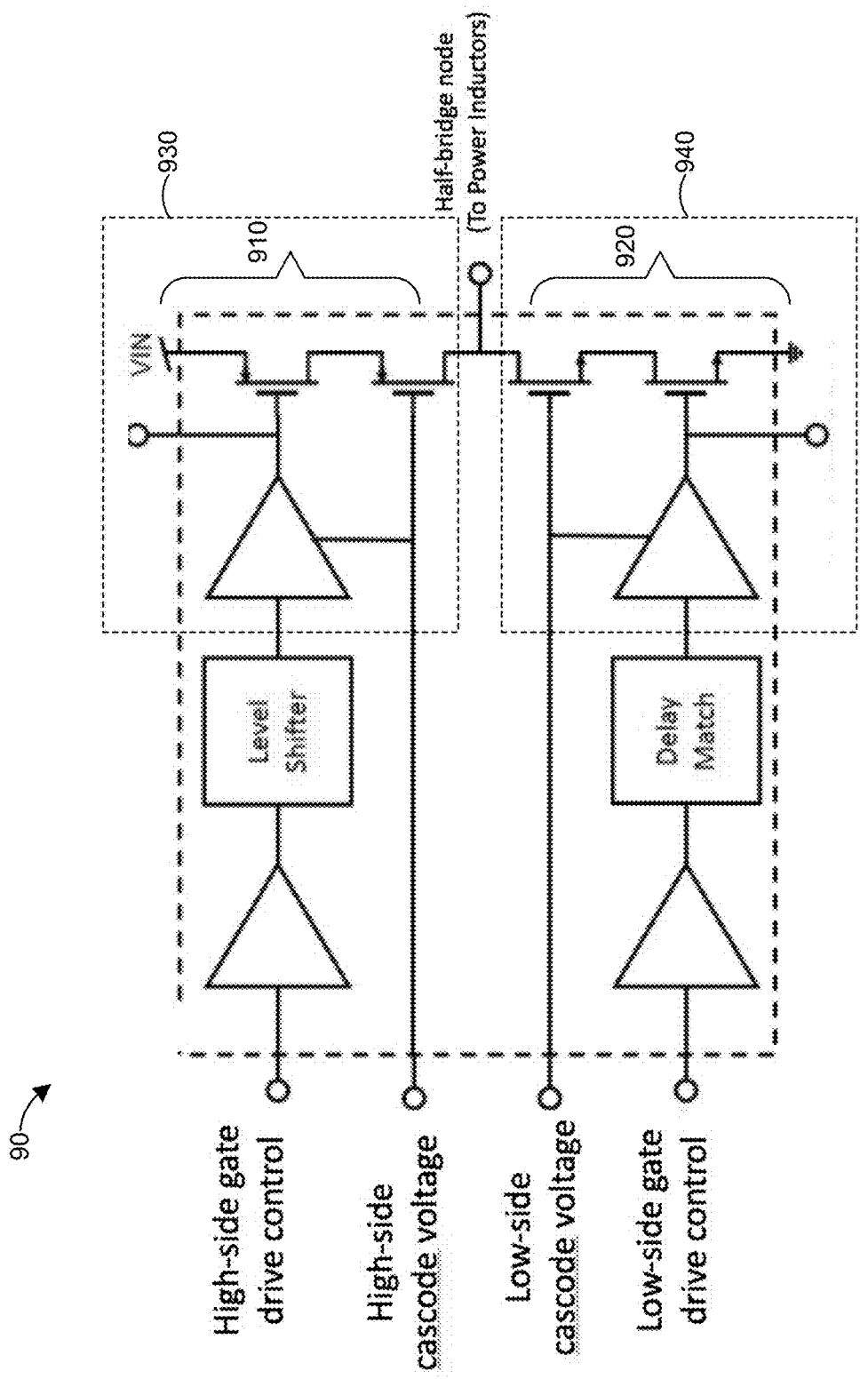
FIG. 9 is a schematic representation of a power switch that can be used in the switched inductor DC-DC power converter chiplets described above according to one or more embodiments.

FIG. 9 is a schematic representation of a power switch 90 that can be used in the switched inductor DC-DC power converter chiplets described above according to one or more embodiments. Thus, switched inductor DC-DC power converter chiplets 10 and 50 can include power switch 90 in place of power switch 160. Power switch 90 includes high-side or PMOS switches 910 and low-side or NMOS switches 920. The high-side switches 910 and low-side switches 920 each include two switches that are in series electrically with one another in a cascode configuration, as illustrated in FIG. 9. The cascode configuration allows the power switch 90 to include "thin-gate oxide" transistors used in current CMOS manufacturing (e.g., in 180 nm, 130 nm, 90 nm, 45 nm, 40 nm, 28 nm, 16 nm, 10 nm, and/or 7 nm technology nodes) but with higher voltage levels than the regular maximum voltage level for such transistors. For example, including two thin-gate oxide transistors that are in series electrically with one another can sustain twice the regular maximum voltage level than a single thin-gate oxide transistor. In addition, the thin-gate oxide transistors only require a small gate charge ($Q_{on}$) to actuate the power switched and they have a small power switch resistance ($R_{on}$) (i.e., the resistance of the switch when it forms a closed circuit). Thus, the performance of the thin-gate oxide transistors in a cascode configuration can provide improved overall performance.

Figure 10:
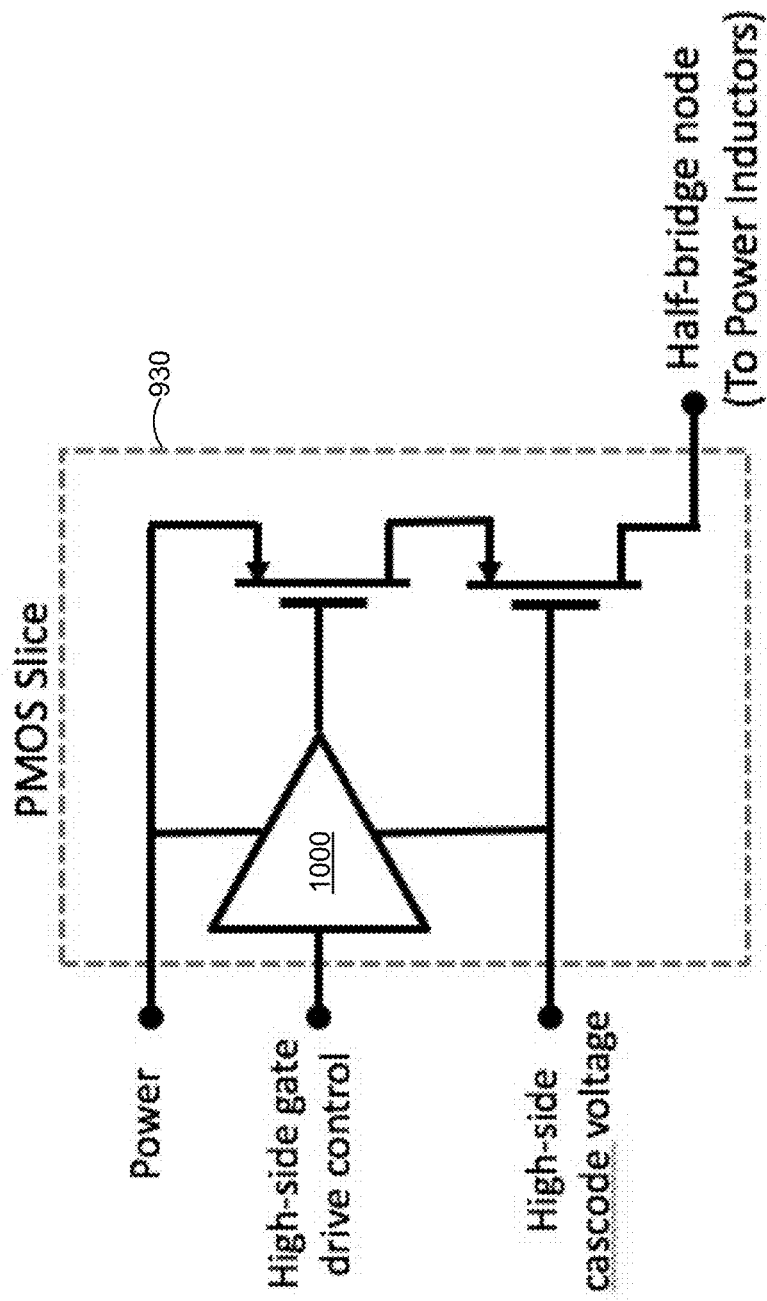
FIG. 10 is a schematic representation of a PMOS slice according to one or more embodiments.
Figure 11:
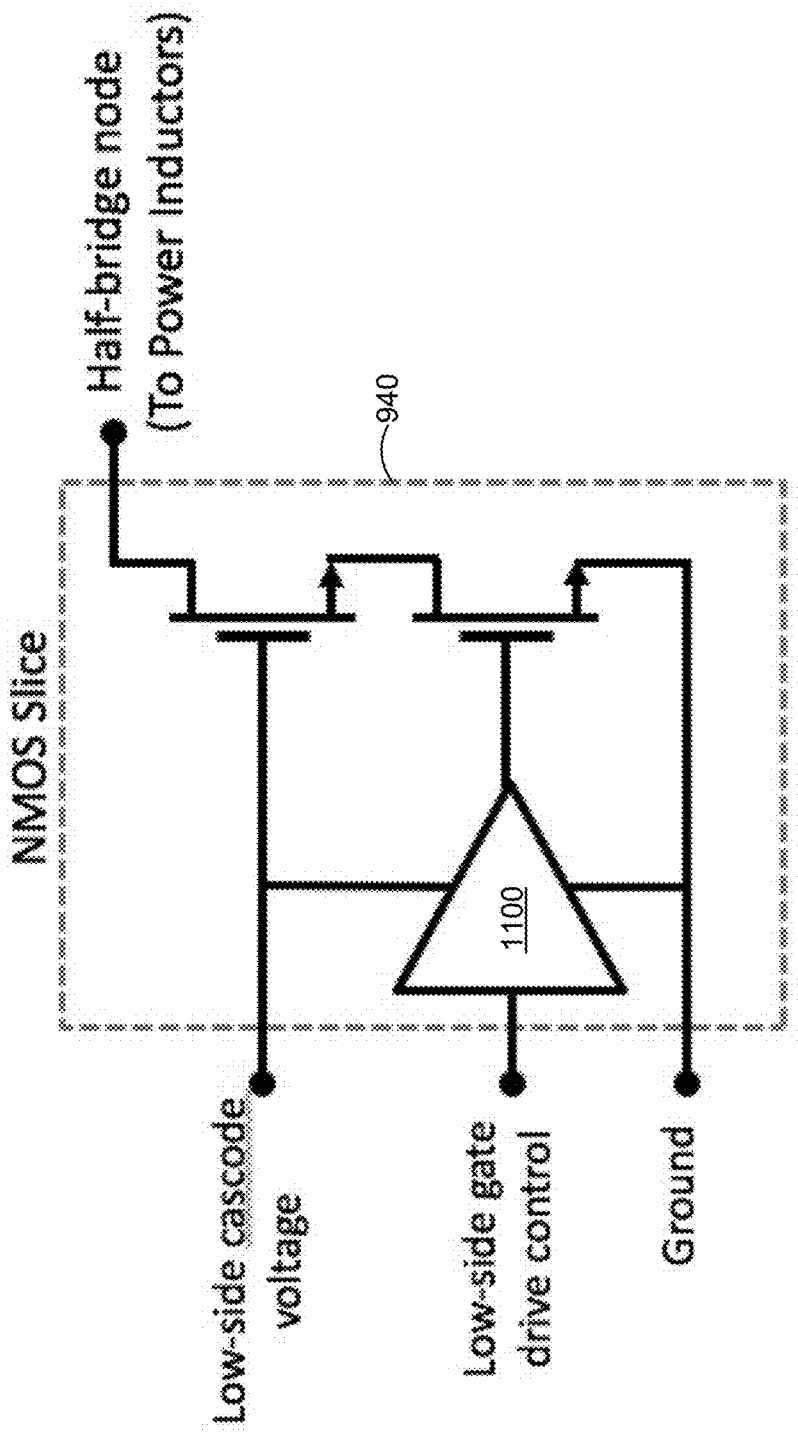
FIG. 11 is a schematic representation of an NMOS slice according to one or more embodiments.

The effective width of power switch 90 can be increased by including additional switches in parallel electrically with high-side switches 910 and by including additional switches in parallel electrically with low-side switches 920. In some embodiments, for example, a PMOS slice 930 and an NMOS slice 940 can be defined, as illustrated in FIGS. 9-11. Power switch 90 can include a plurality of PMOS and NMOS slices 930, 940. Each PMOS slice 930 is disposed in parallel electrically with the other PMOS slices 930, for example in an array. Likewise, each NMOS slice 940 is disposed in parallel electrically with the other PMOS slices 930, for example in an array. By operating each slice 930, 940 in parallel electrically, the total effective width of power switch 90 is N×W_slice, where N is the number of slices and W_slice is the effective transistor channel width for a single slice. Each slice 930, 940 includes a gate drive buffer 1000, 1100, respectively. The buffers 1000, 1100 can ensure that there is sufficient drive strength to actuate the transistors in their respective slices 930, 940.

Figure 12:
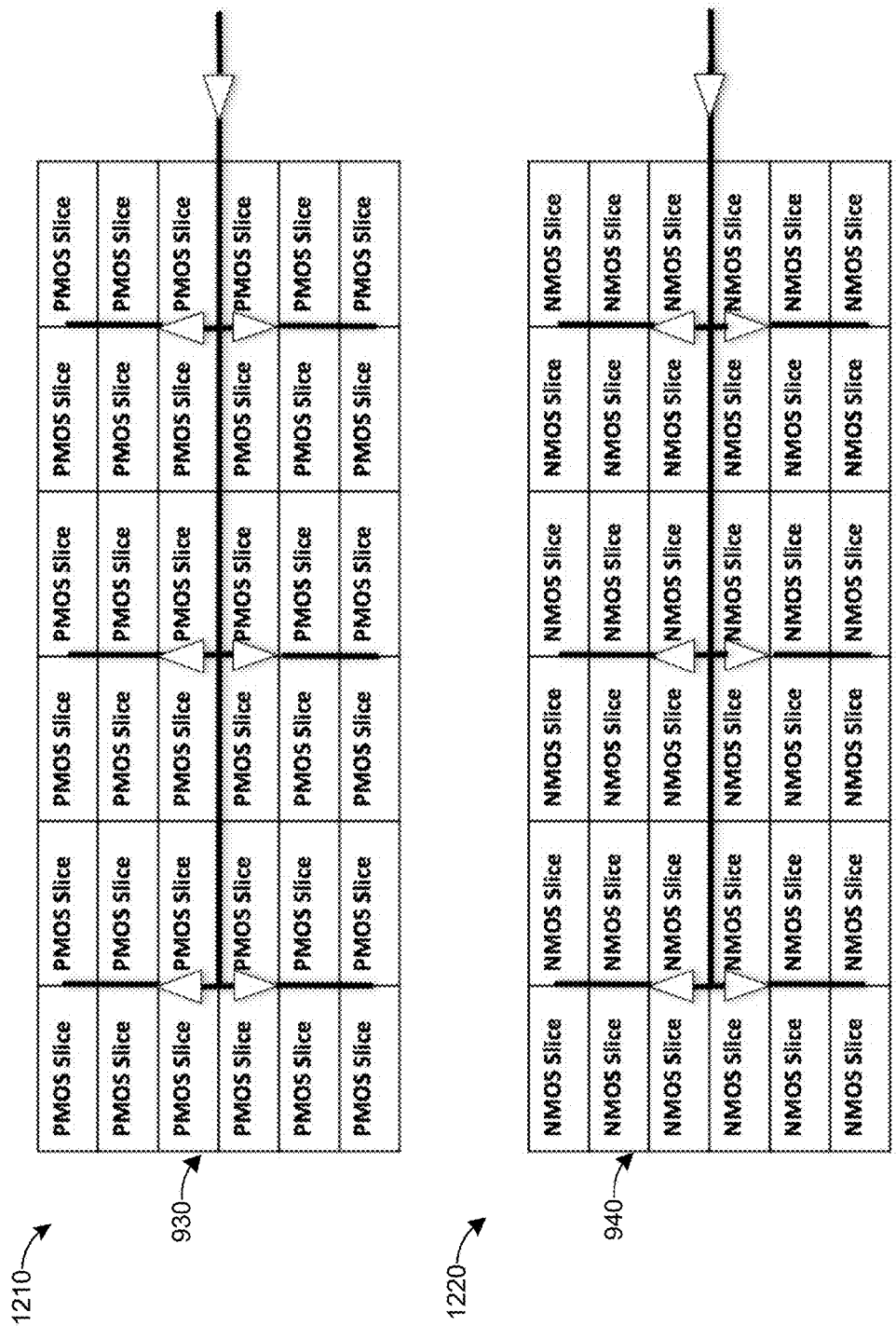
FIG. 12 is an example representation of the physical layout of PMOS and NMOS slices in a power switch.
Figure 13:
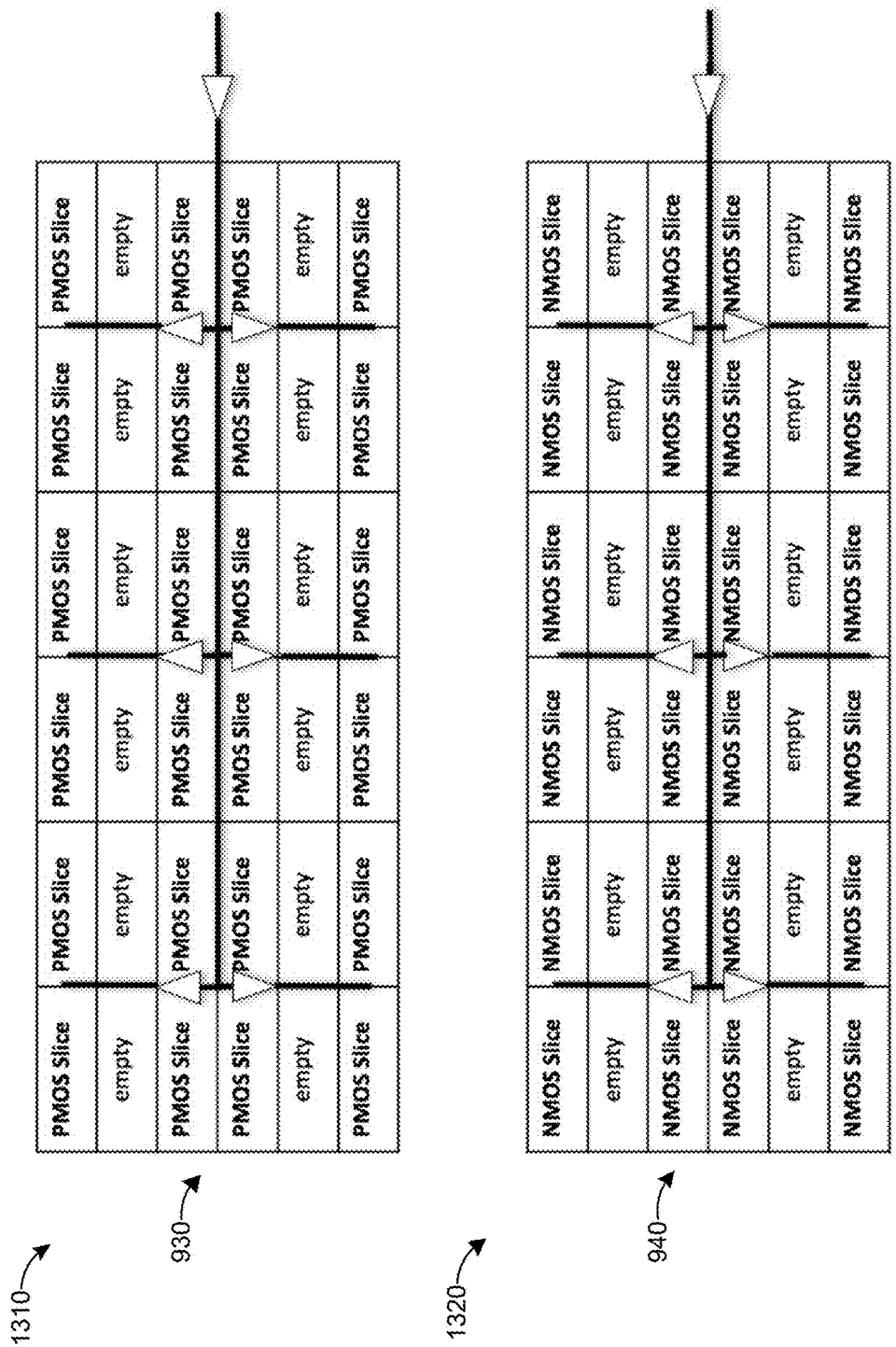
FIG. 13 is another example representation of the physical layout of PMOS and NMOS slices in a power switch.

FIG. 12 is an example representation of the physical layout 1210, 1220 of PMOS and NMOS slices 930, 940, respectively, in power switch 90. In FIG. 12 there are 36 PMOS slices 930 and 36 NMOS slices 940. With this physical layout 1210, 1220 of slices, the effective width of power switch 90 can be conveniently changed according to the expected inductor current for a given power converter design. FIG. 13 is another example representation of the physical layout 1310, 1320 of PMOS and NMOS slices 930, 940, respectively, in power switch 90. In FIG. 13 there are 24 PMOS slices 930 and 24 NMOS slices 940. Physical layout 1310, 1320 is a regular pattern of PMOS and NMOS slices 930, 940, respectively.

Figure 14:
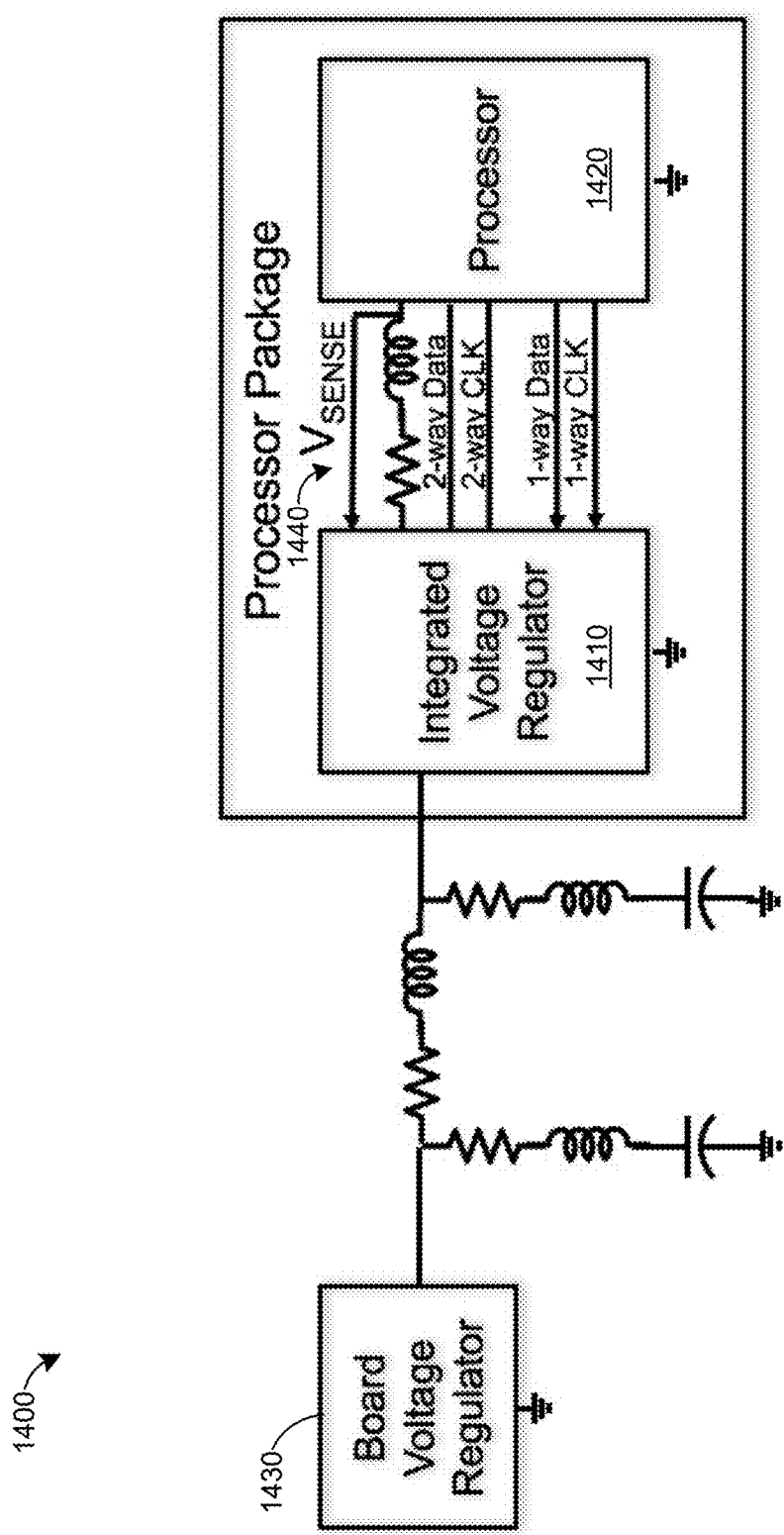
FIG. 14 is a block diagram of an assembly that includes a switched inductor DC-DC power converter chiplet, a processor chip, and a board voltage regulator according to one or more embodiments.

FIG. 14 is a block diagram of an assembly 1400 that includes a switched inductor DC-DC power converter chiplet 1410, a processor chip 1420, and a board voltage regulator 1430 according to one or more embodiments. The switched inductor DC-DC power converter chiplets 1410 can be the same as switched inductor DC-DC power converter chiplet 10 and/or 50 described above. FIG. 14 illustrates that the switched inductor DC-DC power converter chiplet 1410 includes two-way and one-way digital interfaces for communication of data and clock signals to and/or from the processor chip 1420. A feedback voltage sense line 1440 provides a low-error reading of the supply voltage proximal to or immediately proximal to the processor chip 1420 (i.e., the load). In some embodiments, the one-directional serial interfaces can be used to communicate the "power state" of the processor chip 1420 so that the power converter chiplet may quickly load pre-programmed operating parameters for the given load IC power state.

Figure 15:
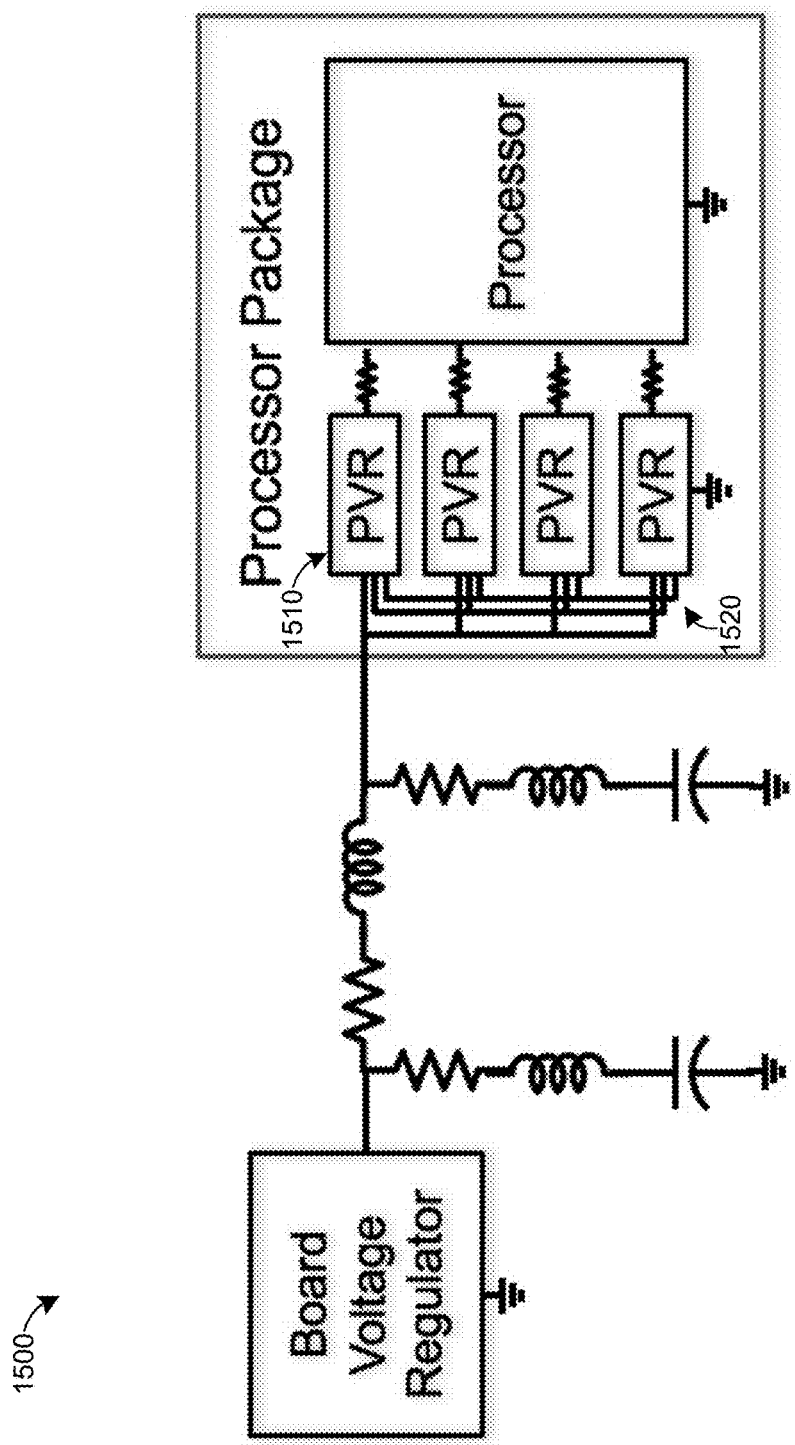
FIG. 15 is a block diagram of an assembly that includes multiple switched inductor DC-DC power converter chiplets that are arranged in parallel electrically with one another according to one or more embodiments.

FIG. 15 illustrates an assembly 1500 that includes multiple switched inductor DC-DC power converter chiplets 1510 can be arranged in parallel electrically with one another to increase the capacity of the power converters, according to one or more embodiments. A two-wire digital serial interface 1520 can be used for information sharing between the different power converter chiplets 1510. For example, the digital serial interface 1520 can be used to maintain a balanced output current such that the output current from each power converter chiplet 1510 is nearly identical.

Figure 16:
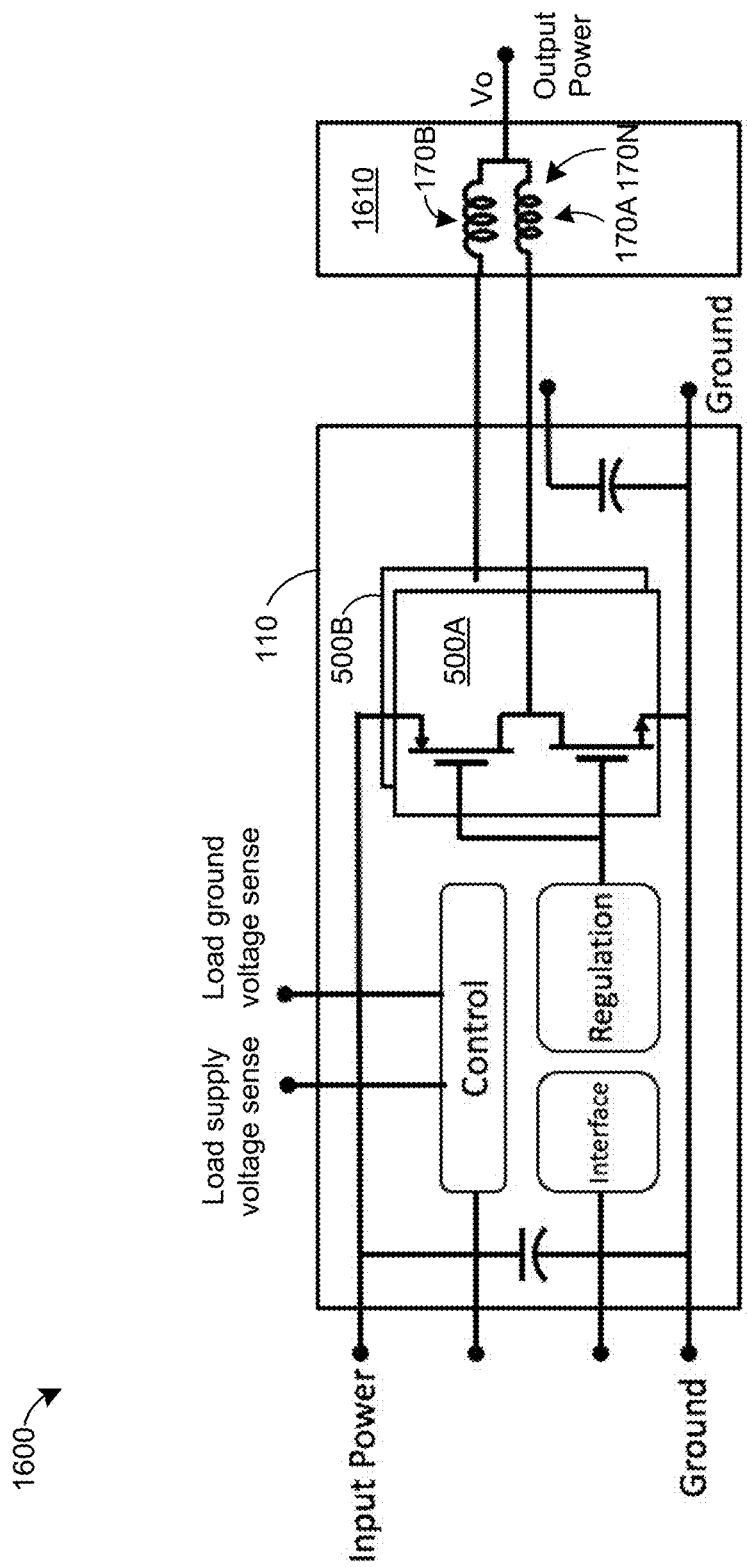
FIG. 16 is a schematic representation of a switched inductor DC-DC power converter chiplet according to one or more embodiments.

FIG. 16 is a schematic representation of a switched inductor DC-DC power converter chiplet 1600 according to one or more embodiments. Switched inductor DC-DC power converter chiplet 1600 is the same or substantially the same as switched inductor DC-DC power converter chiplet 50 except as described below. In FIG. 16, the thin-film inductor(s) 170N are disposed on an interposer 1610 (e.g., a silicon interposer), such as an integrated passive device. The interposer 1610 can be flip-chip attached to the power converter substrate 110. FIG. 16 illustrates that the power converter substrate 110 includes phases 500A, 500B, but it can include only one phase or additional phases (e.g., 500N) in other embodiments.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

What is claimed is:

1. A switched inductor DC-DC power converter, comprising:
   a CMOS power switch;
   an LC filter electrically coupled to an output of the CMOS power switch, the LC filter comprising:
   a thin-film inductor electrically coupled to the output of the CMOS power switch; and
   an output capacitor electrically coupled to an output of the thin-film inductor;
   regulation circuitry electrically coupled to an input of the CMOS power switch;
   feedback control circuitry that regulates a switching frequency of the CMOS power switch; and
   interface circuitry electrically coupled to an input of the control circuitry, wherein the switched inductor DC-DC power converter is integrated on a common substrate; and
wherein the common substrate comprises a multilevel wiring network and the inductor is integrated on top of the multilevel wiring network.

2. The switched inductor DC-DC power converter of claim 1, wherein the conductive winding comprises:
a first wire formed in a first integration plane disposed above the multilevel wiring network;
a second wire formed in a second integration plane disposed above the first integration plane; and
a conductive VIA formed between the first and second wires, the conductive VIA electrically connecting the first wire to the second wire.

3. The switched inductor DC-DC power converter of claim 1, wherein the inductor comprises a planar magnetic core and a conductive winding, the conductive winding turned around the planar magnetic core in a generally spiral manner.

4. The switched inductor DC-DC power converter of claim 1, wherein the inductor comprises a magnetic-clad inductor.

5. The switched inductor DC-DC power converter of claim 1, wherein electrical terminations for the common substrate and the inductor are on a same surface of the common substrate.

6. The switched inductor DC-DC power converter of claim 1, wherein electrical terminations for the common substrate and the inductor are on opposing surfaces of the common substrate and electrical power is communicated through the common substrate to the inductor with through-silicon VIAs.

7. The switched inductor DC-DC power converter of claim 1, wherein the CMOS power switch comprises CMOS transistors with a gate length of 130 nm or less in a cascode configuration.

8. The switched inductor DC-DC power converter of claim 7, wherein the CMOS transistors comprise thin-gate oxide transistors.

9. The switched inductor DC-DC power converter of claim 7, wherein the CMOS power switch comprises an array of PMOS switches and an array of NMOS switches, wherein a first respective gate drive buffer is electrically coupled to each PMOS switch and a second respective gate drive buffer is electrically coupled to each NMOS switch.

10. The switched inductor DC-DC power converter of claim 9, wherein each PMOS switch is in parallel electrically with the other PMOS switches and each NMOS switch is in parallel electrically with the other NMOS switches.

11. The switched inductor DC-DC power converter of claim 1, wherein the CMOS transistors comprise n-type and p-type CMOS transistors for low-side and high-side switching of a half-bridge node, respectively.

12. The switched inductor DC-DC power converter of claim 1, further comprising a two-directional digital serial interface to communicate information and control instructions to and from a load integrated circuit.

13. The switched inductor DC-DC power converter of claim 12, further comprising a one-directional digital serial interface to receive a power state of the load integrated circuit.

14. The switched inductor DC-DC power converter of claim 1, further comprising a two-directional digital serial interface to communicate an output power of the switched inductor DC-DC power converter to other switched inductor DC-DC power converters to form a group of switched inductor DC-DC power converters, the group of switched inductor DC-DC power converters configured to deliver a similar output power to a same load.

15. The switched inductor DC-DC power converter of claim 1, further comprising a digital processing unit integrated on the common substrate.

16. The switched inductor DC-DC power converter of claim 15, wherein the digital processing unit comprises a microprocessor or a graphics processor.

17. The switched inductor DC-DC power converter of claim 1, further comprising a plurality of powertrain phases in parallel electrically with one another, each powertrain phase comprising a phase CMOS power switch and a phase thin-film inductor coupled to an output of the phase CMOS power switch, wherein an output of each phase thin-film inductor is electrically coupled to the output capacitor.

18. The switched inductor DC-DC power converter of claim 17, wherein the control circuitry is configured to operate each powertrain phase in a phase-interleaved manner.

19. The switched inductor DC-DC power converter of claim 1, wherein the common substrate includes separate supply voltage sense and ground reference sense terminations that allow the power converter to measure an output voltage at a load independently of a power delivery channel.

20. A system comprising:
a common substrate comprising:
a CMOS power switch;
an LC filter electrically coupled to an output of the CMOS power switch, the LC filter comprising:
a thin-film inductor electrically coupled to the output of the CMOS power switch; and
an output capacitor electrically coupled to an output of the thin-film inductor;
regulation circuitry electrically coupled to an input of the CMOS power switch;
feedback control circuitry that regulates a switching frequency of the CMOS power switch; and
interface circuitry electrically coupled to an input of the control circuitry; and
wherein the common substrate further comprises a multilevel wiring network and the inductor is integrated on top of the multilevel wiring network.

21. The system of claim 20, further comprising an interposer comprising the thin-film inductor.

22. The system of claim 21, wherein the interposer comprises an integrated passive device.

* * * * *